(12) United States Patent
Costas et al.

(10) Patent No.: US 6,568,997 B2
(45) Date of Patent: May 27, 2003

(54) CMP POLISHING COMPOSITION FOR SEMICONDUCTOR DEVICES CONTAINING ORGANIC POLYMER PARTICLES

(75) Inventors: Wesley D. Costas, Bear, DE (US); Craig D. Lack, Wilmington, DE (US); Daniel A. Saucy, Harleysville, PA (US)

(73) Assignee: Rodel Holdings, Inc., Wilmington, DE (US)

( * ) Notice: Subject to any disclaimer, the term of this patent is extended or adjusted under 35 U.S.C. 154(b) by 29 days.

(21) Appl. No.: 09/826,525

(22) Filed: Apr. 5, 2001

(65) Prior Publication Data

US 2002/0173241 A1 Nov. 21, 2002

(51) Int. Cl.⁷ .................................................. B24B 1/00
(52) U.S. Cl. ............................. 451/41; 451/60; 106/3; 51/307; 216/88
(58) Field of Search ....................... 451/41, 60, 39; 438/692, 693; 216/88–89; 252/79.4; 156/636.1, 345; 106/3, 491, 450, 499; 51/307

(56) References Cited

U.S. PATENT DOCUMENTS

| | | | |
|---|---|---|---|
| 5,958,794 A | | 9/1999 | Bruxvoort et al. |
| 6,083,419 A | * | 7/2000 | Grumbine et al. ......... 252/79.1 |
| 6,316,366 B1 | * | 11/2001 | Kaufman et al. ........... 438/693 |
| 6,328,634 B1 | * | 12/2001 | Shen et al. .................... 461/41 |
| 6,033,596 A1 | * | 3/2002 | Kaufman et al. ......... 252/79.1 |
| 6,362,106 B1 | * | 3/2002 | Kaufman et al. ........... 438/692 |
| 6,375,545 B1 | * | 4/2002 | Yano et al. ................... 451/36 |

FOREIGN PATENT DOCUMENTS

| | | |
|---|---|---|
| EP | 0846 740 A1 | 6/1998 |
| EP | 0913 442 A2 | 5/1999 |
| EP | 0919 602 A2 | 6/1999 |
| EP | 0999 254 A1 | 5/2000 |
| EP | 1020 488 A2 | 7/2000 |
| EP | 1020 501 A2 | 7/2000 |
| EP | 1036 836 A1 | 9/2000 |
| WO | 98/45087 A1 | 10/1998 |
| WO | 99/07515 A1 | 2/1999 |
| WO | 00/43159 A1 | 7/2000 |

OTHER PUBLICATIONS

U.S. patent application No. 0049910–Dec. 13, 2001.*

* cited by examiner

*Primary Examiner*—George Nguyen
(74) *Attorney, Agent, or Firm*—Kenneth A. Benson; Blake T. Biederman

(57) ABSTRACT

This invention is directed to a polishing composition used for the chemical mechanical polishing of semiconductor wafers having a copper metal circuit. The composition has a pH of under 5.0 and comprises the following:

(a) a water soluble carboxylic acid polymer comprising polymerized unsaturated carboxylic acid monomers having a number average molecular weight of about 20,000 to 1,500,000 or blends of high and low number average molecular weight polymers of polymerized unsaturated carboxylic acid monomers;

(b) 1 to 15% by weight of an oxidizing agent, (c) up to 3.0% by weight of abrasive particles, (d) 50–5,000 ppm (parts per million) of an inhibitor, (e) up to 3.0% by weight of a complexing agent, such as, malic acid, and (f) 0.1 to 5.0% by weight of organic polymer particles, wherein the polymer of the organic polymer particles has a number average molecular weight of at least 500,000 determined by GPC (gel permeation chromatography) and a Tg (glass transition temperature) of at least 25° C.

14 Claims, No Drawings

CM P POLISHING COMPOSITION FOR SEMICONDUCTOR DEVICES CONTAINING ORGANIC POLYMER PARTICLES

BACKGROUND OF THE INVENTION

This invention relates to the field of manufacturing semiconductor integrated circuits. In particular, this invention is related to a polishing composition for the chemical mechanical polishing (CMP) of semiconductor substrates.

In the manufacture of integrated circuits, multiple layers of material are successively deposited on a substrate. Typically, a layer of an insulating material, such as, silica, is deposited in pattern that contains a series of troughs and then a metal conductor, such as, copper, is deposited in these troughs to form the circuit or a portion of the circuit. Often, the metal conductor is separated from the insulating material by a buffer material, such as, tantalum nitride. After a layer of material is deposited, the layer must be made flat before a succeeding layer of matter is deposited. The process of removing any excess material and making a layer flat involves controlling the rate of removal of material, such as, metal, buffer material and/or insulating material and is commonly known a "planarization". This process also involves removing protrusions and those portions of the surface that are above the average surface height of the substrate at a higher rate than the removal of material in the recesses that are below the average surface height of the substrate.

CMP is used to planarize these semiconductor substrates. In a typical CMP process, a polishing pad is pressed against the substrate and is moved across the surface of the substrate while an aqueous liquid polishing composition is interposed between the polishing pad and the surface of the substrate being polished. The CMP process combines chemical action and mechanical action. An oxidizer generally is used in the polishing composition that converts metal on the surface of the substrate to an oxide that sometimes serves as an element of a passivating layer that reduces further reaction of the metal with the polishing composition. Generally, mild abrasives are used in the polishing composition to increase the rate of polishing.

Copper, that is electrolytically deposited to form the circuits of a semiconductor, often does not form a uniform layer but a layer having peaks and valleys that must be planarized before the semiconductor can be used or before another layer of material is applied. Conventional polishing compositions, polishing pads and polishing equipment and techniques result in removal of copper in both the peaks and valleys when only removal of the copper from the peaks is desired. Copper, in comparison to the substrate that usually is silica or some other hard substance, is a relatively soft metal and is easily eroded by polishing and areas of copper that do not require polishing or only require a slight amount of polishing must be protected. By using conventional equipment and techniques, the peaks and valley are polished at an almost equal rate. When polishing a line of a copper circuit of the semiconductor device is continued, more of the center of the line is polished rather than on the edges and the result is a low center that may even break through the copper line of the circuit to the substrate that typically is silica. This problem is commonly known as "dishing".

Efforts have been made to reduce or eliminate this dishing problem by using various polishing compositions. European Patent Application (EP 0 913 442 A2) attempts to eliminate the problem by using a variety of compositions some of which contain polyacrylic acid. However, the dishing problem was not overcome. The novel composition of this invention significantly reduces the problem of dishing of copper circuits of semiconductor devices.

SUMMARY OF THE INVENTION

This invention is directed to a polishing composition used for the chemical mechanical polishing of semiconductor wafers having a copper metal circuit. The composition has a pH of under 5.0 and comprises the following:

(a) a water soluble carboxylic acid polymer comprising polymerized unsaturated carboxylic acid monomers having a number average molecular weight of about 20,000 to 1,500,000 or blends of high and low number average molecular weight polymers of polymerized unsaturated carboxylic acid monomers;

(b) 1 to 15% by weight of an oxidizing agent, (c) up to 3.0% by weight of abrasive particles, (d) 50–5,000 ppm (parts per million) of an inhibitor, (e) up to 3.0% by weight of a complexing agent, such as, malic acid, and (f) 0.1 to 5.0% by weight of organic polymer particles, wherein the polymer of the organic polymer particles has a number average molecular weight of at least 500,000 determined by GPC (gel permeation chromatography) and a Tg (glass transition temperature) of at least 25° C.

DETAILED DESCRIPTION OF THE INVENTION

The novel polishing composition of this invention can be used with conventional polishing equipment, known polishing pads and techniques to polish semiconductor wafers having copper circuits. The copper layer on the wafer is polished to remove peaks from the copper layer but little or no polishing occurs in the valleys. Copper is cleared from the surface of the wafer and there is a substantial reduction in dishing of the copper circuits of the wafer in comparison to conventional polishing compositions. The novel polishing composition provides a substantially planar surface that is free of scratches and other defects that commonly result from polishing.

The novel polishing composition of this invention contains organic polymer particles that replace conventional inorganic abrasive particles, such as, silica and alumina. These organic polymer particles do not have the abrasive characteristics of the inorganic abrasive particles but do remove "high spots" of the copper layer of semiconductor circuit and provide a planarized copper layer or copper circuit. Also, the organic polymer particles are selective in that only copper is polished and not other layers of material, such as, tantalum.

The novel polishing composition is an aqueous composition that has a pH under 5.0 and preferably has a pH of 2.8 to 4.2 and more preferably, a pH of 2.8 to 3.8. It has been found that polishing compositions having a pH over 5 and higher result in a reduction of polishing of copper of the semiconductor wafer.

The novel polishing composition contains about 0.05–2.0% by weight, based on the weight of the composition, of a carboxylic acid polymer comprising polymerized unsaturated carboxylic acid monomers and has a number average molecular weight of about 20,000 to 1,500,000. Blends of high and low number average molecular weight carboxylic acid polymers also can be used and are preferred for many polishing uses. These carboxylic acid polymers generally are in solution but under some circumstances may be in the form of an aqueous dispersion.

The number average molecular weight of the aforementioned polymers are determined by GPC (gel permeation chromatography).

Unsaturated carboxylic acid monomers include unsaturated monocarboxylic acids and unsaturated dicarboxylic acids. Typical unsaturated monocarboxylic acid monomers contain 3 to 6 carbon atoms and include acrylic acid, oligomeric acrylic acid, methacrylic acid, crotonic acid and vinyl acetic acid. Typical unsaturated dicarboxylic acids contain 4 to 8 carbon atoms and include the anhydrides thereof and are, for example, maleic acid, maleic anhydride, fumaric acid, glutaric acid, itaconic acid, itaconic anhydride, and cyclohexene dicarboxylic acid. Water soluble salts of the aforementioned acids also can be used.

The term "poly(meth)acrylic acid", as used hereinafter, means polymers of acrylic acid or polymers of methacrylic acid.

Particularly useful are poly(meth)acrylic acids having a number average molecular weight of about 20,000 to 150,000, preferably 25,000 to 75,000 and more preferably, 25,000 to 40,000. Blends of high and low number average molecular weight poly(meth)acrylic acids are particularly preferred. In such blends or mixtures of poly(meth)acrylic acids, a low number average molecular weight poly(meth) acrylic acid having a number average molecular weight of 20,000 to 100,000 and preferably, 20,000 to 40,000 is used in combination with a high number average poly(meth) acrylic acid having a number average molecular weight of 200,000 to 1,500,00, preferably, 150,000 to 300,000. Typically, the weight ratio of the low number average molecular weight poly(meth)acrylic acid to the high number average molecular weight poly(meth)acrylic acid is 10:1 to 1:10,preferably 4:1 to 1:4, and more preferably 2:1 to 1:2.

One particularly preferred blend comprises a polyacrylic acid having a number average molecular weight of about 30,000 and a polyacrylic acid having a number average molecular weight of about 250,000 in a 1:1 weight ratio.

It is possible to use very low number average molecular weight poly(meth)acrylic acid polymers in the aforementioned blend. Examples of such polymers are poly(meth) acrylic acid polymers having a number average molecular weight of 1,000 to 5,000.

For some polishing compositions, high carboxylic acid containing copolymers and terpolymers can be used in which the carboxylic acid component comprises 5–75% by weight of the polymer. Typical of such polymer are polymers of (meth)acrylic acid and acrylamide or methacrylamide; polymers of (meth)acrylic acid and styrene and other vinyl aromatic monomers; polymers of alkyl (meth) acrylates (esters of acrylic or methacrylic acid) and a mono or dicarboxylic acid, such as, acrylic or methacrylic acid or itaconic acid; polymers of substituted vinyl aromatic monomers having substituents, such as, halogen, i.e., chlorine, fluorine, bromine, nitro, cyano, alkoxy, haloalkyl, carboxy, amino, amino alkyl and a unsaturated mono or dicarboxylic acid and an alkyl (meth)acrylate; polymers of monethylenically unsaturated monomers containing a nitrogen ring, such as, vinyl pyridine, alkyl vinyl pyridine, vinyl butyrolactam, vinyl caprolactam, and an unsaturated mono or dicarboxylic acid; polymers of olefins, such as, propylene, isobutylene, or long chain alkyl olefins having 10 to 20 carbon atoms and an unsaturated mono or dicarboxylic acid; polymers of vinyl alcohol esters, such as, vinyl acetate and vinyl stearate or vinyl halides, such as, vinyl fluoride, vinyl chloride, vinylidene fluoride or vinyl nitriles, such as, acrylonitrile and methacrylonitrile and an unsaturated mono or dicarboxylic acid; polymers of alkyl (meth) acrylates having 1–24 carbon atoms in the alkyl group and an unsaturated monocarboxylic acid, such as, acrylic acid or methacrylic acid. These are only a few examples of the variety of polymers that can be used in the novel polishing composition of this invention.

Also, it is possible to use polymers that are biodegradeable, photdegradeable or degradeable by other means. An example of such a composition that is biodegradeable is a polyacrylic acid polymer containing segments of poly(acrylate co methyl 2-cyanoacrylate).

The novel polishing composition contains 1 to 15% by weight of an oxidizing agent. Typical oxidizing agents are hydrogen peroxide, iodates, such as, potassium iodate, nitrates, such as, cesium nitrate, barium nitrate, ammonium nitrate, mixtures of ammonium nitrate and cesium nitrate, carbonates, such as, ammonium carbonate, persulfates, such as, ammonium and sodium persulfate, and perchlorates. Generally, the polishing composition contains about 5–10% by weight of an oxidizing agent. Preferably, the polishing composition contains about 9% by weight of hydrogen peroxide as the oxidizing agent.

The novel polishing composition preferably does not contain inorganic abrasive particles but to increase the rate of polishing of the novel polishing composition, the composition can contain 0.01% up to 3% by weight of inorganic abrasive particles. Typical inorganic abrasive particles are those that are typically used in CMP polishing of semiconductors, such as, alumina, silica, ceria, germania, diamond, silicon carbide, titania, zirconia, boron nitride, boron carbide and various mixtures of any of the above. Preferred abrasive particles when used in the composition are alumina and silica or mixtures thereof.

The novel polishing composition contains about 50 to 5,000 ppm (parts per million) of an inhibitor preferably BTA (benzotriazole), or TTA (tolyltriazole) or mixtures thereof. Other inhibitors that can be used are 1-hydroxybenzotriazole, N-(1H-benzotriazole-1-ylmethyl) formamide, 3,5-dimethylpyrazole, indazole, 4-bromopyrazole, 3-amino-5-phenylpyrazole, 3-amino-4-pyrazolecarbonitrile, 1-methylimidazole, Indolin QTS and the like.

The novel composition contains 0.1–5.0% by weight, based on the weight of the composition, of polymer particles having a number average molecular weight of at least 500,000 determined by GPC (gel permeation chromatography) and a Tg (glass transition temperature) of at least 25° C. Preferably, the composition contains 0.25–1.0% by weight, based on the weight of the composition, of polymers have a number average molecular weight of 500,000 to 3,000,000 and a Tg of 25 to 130° C. and more preferably, 25 to 90° C.

The Tg of the polymer is measured using differential scanning calorimeter (DSC) from Texas Instruments (model 2010). The procedure is well known to those skilled in the art. Basically, polymer samples are heated in nitrogen starting at ambient temperature and heating at 20° C. per minute through the glass transition temperature recording mid point values.

Preferably, the polymer particles have a diameter in the range of 5 to 5,000 nm and more preferably of 50 to 1500 nm.

The polymer particles can be formed of a homogeneous polymer, a copolymer, a terpolymer, blends of two or more polymers, crosslinked homogeneous polymers, crosslinked blends of polymers, core-shell polymers in which the core is of a different composition from the shell or graft copolymers. These polymer particles can be solid particles or can be in the form of a hollow sphere. The important characteristic is that these polymers do not provide the same level of abrasion as inorganic particles but provide a substantially lower level of abrasion to the polishing composition.

Typically useful polymer particles are polymers of styrene, copolymers and terpolymers of styrene, acrylonitrile, methyl methacrylate, copolymers and terpolymers of methyl methacrylate and an alkyl acrylate wherein the alkyl group has 1–18 carbon atoms or an alkyl methacrylate where the alkyl group has 2–18 carbon atoms and can contain small percentages of polymerized ethylenically unsaturated carboxylic acids, such as, methacrylic acid or acrylic acid or hydroxy alkyl acrylates or methacrylates or amino alkyl acrylates or methacrylates. These polymers can be crosslinked with monomers such as, divinyl benzene. One useful polymer is a polymer of styrene crosslinked with divinyl benzene which can be in the form of hollow spheres.

Graft copolymers can be used, for example, a graft copolymer having a backbone of relatively high Tg polymer, like polymethyl methacrylate and side chains of a comparatively low Tg polymer of an alkyl acrylate, like butyl acrylate. Similarly, the graft copolymer can have a backbone of a low Tg polymer, such as, 2 ethylhexyl acrylate and side chains of macromonomers containing a major amount of polymethyl methacrylate. Particles of a core shell polymer can be used in which the shell is of a high Tg polymer, such as, polymethyl methacrylate and the core is a lower Tg polymer, such as, ethyl acrylate.

Typical monomers that can be used to form the aforementioned polymer particles are methyl methacrylate, ethyl methacrylate, propyl methacrylate, butyl methacrylate, pentyl methacrylate, hexyl methacrylate, octyl methacrylate, lauryl methacrylate, stearyl methacrylate, methyl acrylate, ethyl acrylate, propyl acrylate, butyl acrylate, pentyl acrylate, hexyl acrylate, octyl acrylate, lauryl acrylate, stearyl acrylate, cyclohexyl acrylates and methacrylates, acrylonitrile, styrene, alpha methyl styrene, vinyl toluene, hydroxy alkyl acrylates and methacrylates such as hydroxy ethyl acrylate, hydroxy propyl acrylate, hydroxy butyl acrylate, hydroxy ethyl methacrylate, hydroxy propyl methacrylate, hydroxy butyl methacrylate, amino alkyl acrylates and methacrylates such as amino ethyl acrylate, amino propyl acrylate, amino butyl acrylate, amino ethyl methacrylate, amino propyl methacrylate, amino butyl methacrylate. Other suitable monomers that may be used include: acrylamide, methacrylamide, alkoxy methyl acrylamides and methacrylamides.

The above polymers particles can be formed by conventional techniques well known to those skilled in the art. An aqueous latex can be formed and added to form the polishing composition of this invention or solution polymerization techniques can be used to form polymer particles and solvent removed and the particles dispersed in water and added directly to form the polishing composition.

The novel composition contains up to 3.0% by weight and preferably, 0.1–1.0% by weight of a complexing agent, such as, a carboxylic acid having two or more carboxyl groups and having a hydroxyl group as disclosed in Brancaleoni et. al. U.S. Pat. No. 5,391,258, issued Feb. 21, 1995, which is hereby incorporated by reference. Typical complexing agents include straight chain mono- and dicarboxylic acids and their salts, such as, malic acid and malates, tartaric acid and tartarates, gluconic acid and gluconates, citric acid and citrates, malonic acid and malonates, formic acid and formates, lactic acid and lactates. Polyhydroxybenzoic acid, phthalic acid and salts thereof also can be used.

The polishing composition may further contain pH buffers, such as, amines, and may contain surfactants, deflocculants, viscosity modifiers, wetting agents, cleaning agents and the like.

The following are typical polishing pads that can be used with the novel polishing composition of this invention to polish copper containing semiconductors: a metals pad described in Roberts et. al. U.S. Pat. No. 6,022,268, issued Feb. 8, 2000, a polishing pad containing particles for polishing described in Cook et. al. U.S. Pat. No. 5,489,233, issued Feb. 6, 1996, a polishing pad of polymer impregnated fiber matrices sold by Rodel Inc. under the trade name SUBA, a pad of a polymer sheet containing void spaces formed by in situ production or incorporation of hollow fill materials (typical of such a pad are those that are sold by Rodel Inc. under the trade names POLITEX and IC 1010), a pad of polymer sheets containing solid particles that are added as fillers that may optionally contain void spaces, effected either by in situ production or by incorporation of hollow filler materials (typical of such a pad are those sold by Rodel Inc. under the trade name MH), and a composite pad of multiple layers of materials whose outer substrate that contacts the surface of the semiconductor being polished is one of the pads selected from the above.

The following examples illustrate the invention. All parts and percentages are on a weight basis unless otherwise indicated and molecular weights are determined by gel permeation chromatography unless otherwise indicated.

EXAMPLE 1

The Following Polishing Compositions were Prepared:

Control Polishing Composition

The polishing composition was prepared by thoroughly blending together the following constituents: 0.3 parts benzotriazole, 0.22 parts malic acid, 0.09 parts of polyacrylic acid having a number average molecular weight of 30,000, 0.9 parts of polyacrylic acid having a number average molecular weight of 250,000 and 9.0 parts hydrogen peroxide and sufficient deionized water to bring the total parts of polishing composition to 100.

Polishing Composition 1

(1% "Sunspheres")—identical to the above control composition except that 1% by weight of "Sunspheres" was blended with the control composition. "Sunspheres" have a diameter of 350 μm, are manufactured by Rohm and Haas Company and are hollow spheres composed of polystyrene crosslinked with divinyl benzene and have a Tg of 81° C.

Polishing Composition 2

(1% "Rovace" 661)—identical to the above control composition except that 1.0% "Rovace" 661 was blended with the control composition. "Rovace" 661 have diameter of 300 nm, are manufactured by Rohm and Haas Company, are polymer particles of polyvinyl acetate (PVA) having a number average molecular weight of approximately 1 million and have a Tg of 21° C.

Polishing Composition 3

(1% "Ropaque" HP-1055)—identical to the above control composition except that 1% "Ropaque HP-1055 was blended with the control composition. Ropaque HP-1055 are polymer particles having a diameter of 1000 μm, are manufactured by Rohm and Haas Company, are polymer particles of polystyrene that are crosslinked and have a Tg of 83° C.

Polishing Composition 4

(1% HG 74 P)—identical to the above control composition except that 1% HG 74 P was blended with the control composition. HG 74 P are polymer particles manufactured by Rohm and Haas Company, are polymer particles of polymethyl methacrylate having a number average molecular weight of approximately 1 million and have a Tg of 29° C.

Conventional Polishing Composition 5

(1% "Klebosol")—identical to the above control composition except that 1% "Klebosol was blended with the control composition. "Kiebosol" is colloidal silica having a particle diameter of 12 nm, has abrasive characteristics and is manufactured by Clariant Corporation.

Test for Dishing of Copper of a Copper Pattern Wafer

Wafer tested—electroplated 200 mm copper pattern wafer of silicon dioxide (100 um copper lines) and having Sematech 931 mask.

Test Pad—Metal 26 pad manufactured by Rodel Inc. Newark, Del. (described in U.S. Pat. No. 6,022,268).

Tool used for test—Applied Materials Mira polishing machine.

The wafer was polished with the control polishing composition using the following polishing parameters until the end point was detected by the polishing machine.

Down force 5 psi (351.5 g/cm$^2$)
Platen speed—93 rpm
Carrier Speed—87 rpm
Slurry Flow—250 ml/min After the end point was detected, polishing was continued except the down force was reduced to 3 psi (210.9 g/cm$^2$) until the endpoint trace on the polishing machine flattens (i.e., the slope of the curve is zero). At this point all removal of copper had stopped and no copper was present. The time was recorded for each of the above polishing steps.

The dishing of the copper pattern lines of the wafer was measured on a Tencor P1 profilometer. The 100 um lines in the center of the wafer were measured, the 100 um lines in the middle of the wafer were measured (i.e., half way between the center and edge of the wafer) and the 100 um lines near the edge of the wafer were measured (i.e., about 1 inch from the edge of the wafer). Separate wafers as described above were polished under the same conditions with each of the above prepared Polishing Compositions 1–5. The results are shown below in Table 1 for each of the polishing compositions.

TABLE 2

| Polishing Composition | Dishing Center | Dishing Middle | Dishing Edge |
|---|---|---|---|
| Control Composition 0% Polymer Particles | 900 A | 875 A | 1500 A |
| Composition 1 1.0% hollow crosslinked polystyrene particles | 420 A | 900 A | 1000 A |
| Composition 2 1.0% PVA particles | No removal | No removal | No removal |
| Composition 3 1.0% Polystyrene particles | 700 A | 900 A | 750 A |
| Composition 4 1.0% PMMA particles | — | 1500 A | 800 A |
| Composition 5 1.0% Colloidal Silica particles | 1500 A | 2000 A | 1800 A |

A-Angstroms

The above results showed a decrease in dishing of copper lines on the addition of relatively hard polymer particles, such as, crosslinked polystyrene and PMMA, no polishing or dishing occurred with Composition 2 that contained relative soft polymer particles which is not acceptable for a polishing composition, and excessive dishing occurred with Composition 5 that contained a conventional abrasive of colloidal silica which also is not acceptable for a commercial polishing composition. The "step height" of Compositions 1, 3 and 4 that contained of relatively hard polymer particles was improved and dishing is reduced. "Step height" is a measure of improved planarization efficiency that lowers dishing of lines upon clearing of the wafer at the end of polishing.

What is claimed is:

1. An aqueous polishing composition used for the chemical mechanical polishing of semiconductor devices having a copper metal circuit and having a pH of under 5.0 and comprises
    (a) a water soluble carboxylic acid polymer comprising polymerized unsaturated carboxylic acid monomers having a number average molecular weight of about 20,000 to 1,500,000
    (b) 1 to 15% by weight of an oxidizing agent,
    (c) up to 3.0% by weight of abrasive particles,
    (d) 50–5,000 ppm (parts per million) of an inhibitor,
    (e) up to 3.0% by weight of a complexing agent, and
    (f) 0.1 to 5.0% by weight of organic polymer particles, wherein the polymer has a number average molecular weight of at least 500,000 determined by gel permeation chromatography and a glass transition temperature of at least 25° C.

2. The aqueous polishing composition of claim 1 containing 0.05 to 2.0% by weight water soluble carboxylic acid polymer and in which the organic polymer particles have a diameter of 5 to 5,000 nm and the polymer of the particles has a number average molecular weight of 500,000 to 3,000,000 and a glass transition temperature of 25 to 130° C.

3. The aqueous polishing composition of claim 2 in which the polymer of the organic polymer particles comprises polystyrene.

4. The aqueous polishing composition of claim 3 in which the polystyrene is crosslinked with divinyl benzene and is in the form of hollow spheres.

5. The aqueous polishing composition of claim 2 in which the organic particles comprise polymethyl methacrylate.

6. The aqueous polishing composition of claim 2 in which the inhibitor is an aromatic compound.

7. The aqueous polishing composition of claim 6 in which the inhibitor is benzotriazole.

8. The aqueous polishing composition of claim 1 in which the polycarboxylic acid polymer consist essentially of a blend of poly(meth)acrylic acid of a low number average molecular weight polymer having a molecular weight of 20,000 to 100,000 and a high number average molecular weight polymer having a molecular weight of 200,000 to 1,500,000.

9. The aqueous polishing composition of claim 8 in which the polycarboxylic acid polymer consist essentially of a blend of polyacrylic acid having number average molecular weight of 30,000 and polyacrylic acid having a number average molecular weight of 250,000 in a 1:1 weight ratio.

10. The aqueous polishing composition of claim 1 in which the oxidizing agent is hydrogen peroxide.

11. The aqueous polishing composition of claim 1 in which the complexing agent is malic acid.

12. The aqueous polishing composition of claim 1 containing 0.01% and up to 3% by weight of inorganic abrasive particles.

13. The aqueous polishing composition of claim 1 in which the polycarboxylic acid polymer consist essentially of a blend of polyacrylic acid having number average molecular weight of 30,000 and polyacrylic acid having a number average molecular weight of 250,000 in a 1:1 weight ratio, the oxidizing agent is hydrogen peroxide, the complexing agent is malic acid, and the polymer particles are selected from the group consisting of polystyrene, polystyrene crosslinked with divinyl benzene and polymethyl methacrylate and the polymer particles having a number average molecular weight of 500,000 to 3,000,000.

14. A method of polishing a surface of a semiconductor wafer having a copper metal circuit comprising the steps of:
 (a) providing a polishing pad having a polishing surface,
 (b) holding said wafer in a carrier such that the surface of the wafer is in contact with the polishing surface of polishing pad,
 (c) moving said carrier to provide both pressure on the surface of the wafer and relative lateral motion between the surface of the wafer and the polishing surface; and
 (d) providing the aqueous polishing composition of claim 1 at an interface between the surface of the wafer and the polishing surface.

* * * * *